Figure 1:
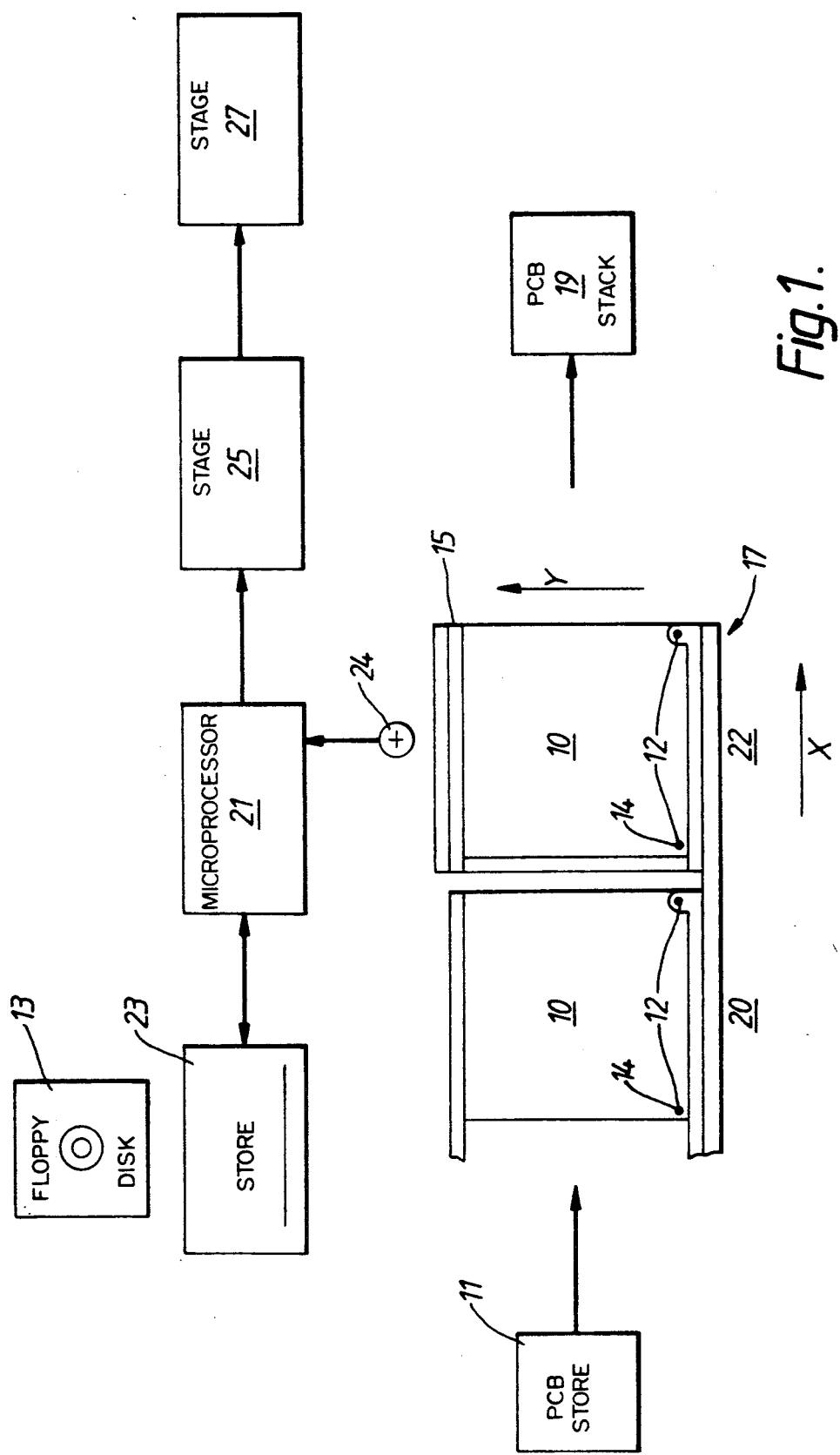
Figure 2:
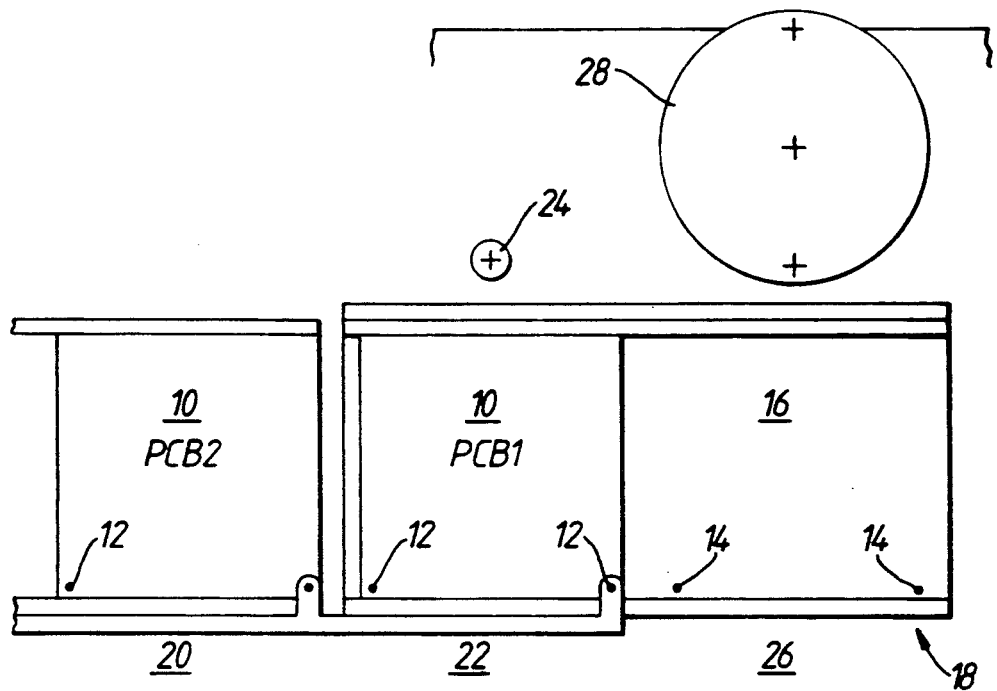
Figure 3:
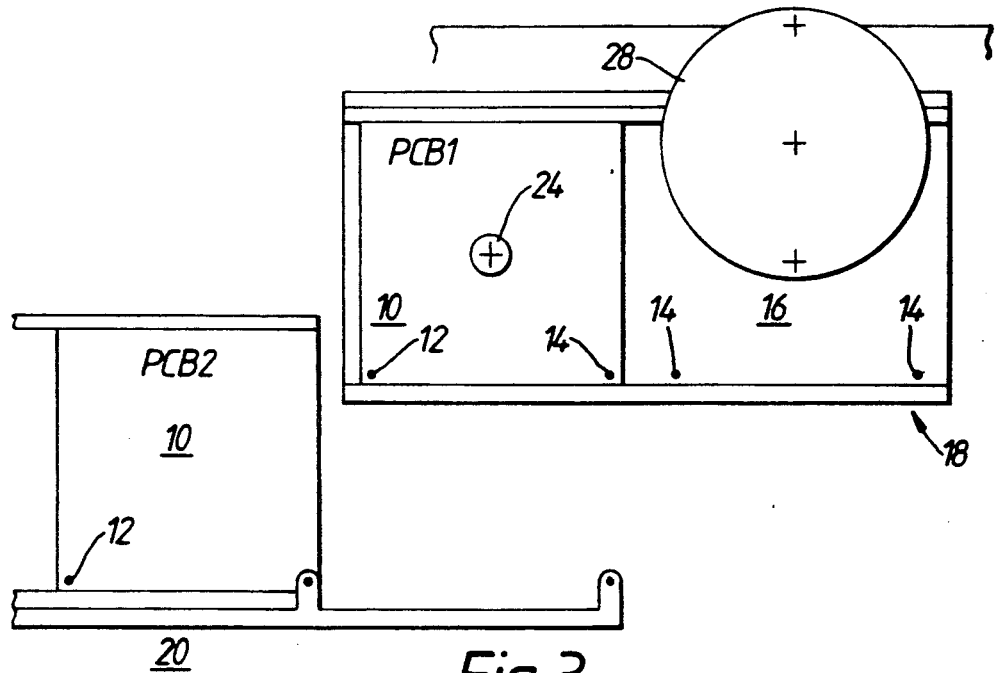

United States Patent [19]
Clough et al.

[11] Patent Number: 5,134,664
[45] Date of Patent: Jul. 28, 1992

[54] CUSTOMIZED ALIGNMENT FOR PCB ASSEMBLY

[75] Inventors: Arthur B. Clough, Merseyside; Stephen Mainwaring, Gwynedd; Alison R. Dunne, Liverpool, all of Great Britain

[73] Assignee: GEC Plessey Telecommunications Limited, Coventry, England

[21] Appl. No.: 780,458

[22] Filed: Oct. 22, 1991

Related U.S. Application Data

[63] Continuation of Ser. No. 349,602, May 10, 1989, abandoned.

[30] Foreign Application Priority Data

May 10, 1988 [GB] United Kingdom ............... 8811005
Apr. 14, 1989 [GB] United Kingdom ............... 8908505

[51] Int. Cl.$^5$ ................................................ G06K 9/00
[52] U.S. Cl. ......................................... 382/8; 358/101; 382/34
[58] Field of Search ..................... 382/8, 44, 30, 34, 1; 364/512; 358/101, 106, 107

[56] References Cited

U.S. PATENT DOCUMENTS

| | | |
|---|---|---|
| 4,635,289 | 1/1987 | Doyle et al. ............................ 382/8 |
| 4,672,676 | 6/1987 | Linger ..................................... 382/8 |
| 4,680,672 | 7/1987 | Sase et al. ............................... 382/8 |
| 4,783,826 | 11/1988 | Koso ....................................... 382/8 |
| 4,799,268 | 1/1989 | McLean et al. ........................ 382/8 |
| 4,803,735 | 2/1889 | Nishida et al. ......................... 382/8 |
| 4,811,410 | 3/1989 | Amir et al. ............................. 382/8 |
| 4,821,157 | 4/1989 | Birk et al. .............................. 382/8 |
| 4,855,928 | 8/1989 | Yamanaka .............................. 382/8 |

*Primary Examiner*—Joseph Mancuso
*Attorney, Agent, or Firm*—Fleit, Jacobson, Cohn, Price, Holman & Stern

[57] ABSTRACT

A method of and an apparatus for article registration are disclosed in which surface characteristics such as component locations of printed circuit boards are viewed and compared with a model. The differences so determined are stored for subsequent use in, for example, the placing of components on the boards.

11 Claims, 3 Drawing Sheets

CUSTOMIZED ALIGNMENT FOR PCB ASSEMBLY

This application is a continuation, of application Ser. No. 07/349,602, filed May 10, 1989 now abandoned.

This invention concerns a method of registering an article in a predetermined disposition prior to manufacturing steps dependant upon the exactly known position of the article. One manufacturing procedure in which accurate article registration is necessary is the insertion or onsertion of components in predetermined locations of a printed circuit board (PCB). PCB's are produced by methods including photo-fabrication. To this end, they are provided with registration holes which mate with appropriate registration pins at the requisite stages of manufacture. Manufacturing tolerances are such that even when a PCB is mounted in engagement with the registration pins, it may not be sufficiently accurately aligned for subsequent placement of components thereon. This problem has been accentuated by the moves towards greater complexity of layout, increases in the number of components to be placed, size of the components and increases in packing density. A manufacturer must now either take greater care in reducing manufacturing tolerances (thus increasing costs) or alternatively must accept a higher rate of rejects (also increasing costs).

It is an object of the present invention to provide an improved method of registration wherein the aforesaid disadvantages are overcome.

According to the present invention, there is provided a method of registration of an article of a series of articles whose surface characteristics must be accurately known for subsequent manufacturing steps, comprising positioning a first article of the series on a comparator, comparing the surface characteristics of the article with a desired model, determining the differences between the surface characteristics of the article and the desired model, and storing the differences for subsequent use in manufacturing operations.

The differences may be stored on a magnetic medium such as a floppy disc readable by subsequent apparatus, a manufacturing operation of which is dependant upon the surface characteristics of the article.

In a production line, the method of the invention may be effected as a first step and the differences may be fed in synchronism to subsequent production line stages whereat a manufacturing operation, requiring knowledge of the surface characteristics, is effected.

In one embodiment, a first article may be positioned on a registration plate which is adjustable to a best fit of the article and the model, the movement of the registration plate constituting a vector difference or a mean vector difference, which can be applied in a subsequent manufacturing stage.

The registration plate may be held in its "best fit" position when a next article of the series of articles is positioned thereon and the surface characteristics of the next article compared with an updated model (to which the vector difference or the mean vector difference has been applied) and the registration plate again adjusted to a best fit of the article and up-dated model, the vector difference or the mean vector difference so determined being applied in the comparison of a next article of the series.

In this way, a series of articles which will probably all have the same or similar differences of location of surface characteristics from the desired model after the first, require adjustment of the registration plate to account only for the differences of the article from its preceding article.

In yet another embodiment, the differences, or the mean difference which may be stored as vectors or a vector may be stored by means of a machine readable code applied to the article for reading by subsequent apparatus during manufacturing operations dependent upon the surface characteristics of the article.

Where the article is a printed circuit board for the insertion or onsertion of components by subsequent gluing and/or placing machines, the surface characteristics compared by the method of the invention are conveniently the individual component locations. The stored differences then permit a gluing and/or placing machine to carry out its operation with greater accuracy.

The invention also provides article registration means comprising a registration plate whereon a first article of a series of articles may be mounted, means for viewing the surface characteristics of the article on a pixel-by-pixel basis and for comparing the viewed article with a stored desired model, means for determining the difference between each surface characteristic and the corresponding characteristic of the desired model, and means for storing the so ascertained differences.

The storage means may comprise a magnetic medium such as a floppy disc.

The viewing means may comprise a video camera for imaging the surface characteristics, and the comparison means may comprise a computer for comparing, on a pixel-by-pixel basis, the surface characteristics of the article with the stored model.

In one embodiment, means for adjusting the registration plate are provided to position the article in a "best fit" position and a subsequent article to be compared may be mounted in the adjusted position of the registration plate before having its surface characteristics compared with the model. Thereafter, the registration plate may be further adjusted in accordance with differences therebetween.

The article is preferably a printed circuit board (PCB) and the surface characteristics are locations for components. The article preferably has registration means for co-operation with registration or data pins on the registration plate.

The registration plate may comprise an X-Y table having precision adjusting means. The X-Y table conveniently is stepped through a program to present different component locations of an article mounted thereon at a viewing station and, in each such location, the surface characteristics of the article are conveniently compared to a model of the surface characteristics of a correctly positioned article at such location, and corresponding adjustments (differences) to the program are made.

Image processing means are conveniently provided for determining the differences and/or "best fit" between an image of an article on the registration plate and the desired model.

Conveyor means may be provided for feeding the articles seriatim to the registration plate, and each article is preferably clamped to the registration plate in its registration position.

The invention will be described further, by way of example, with reference to the accompanying drawings, in which:

FIG. 1 is a schematic view of an article registration and comparison means for carrying out the method of the present invention; and, FIGS. 2 to 5 illustrate further steps of the method of article registration according to the present invention.

Referring firstly to FIG. 1 of the drawings, the invention will be described with reference to printed circuit boards (PCB's), for subsequent use in an automated component placing station of a manufacturing process. It is essential, in such a process, that each PCB be accurately registered and its component locations, surface characteristics, be known. To this end, each PCB 10 of a series of PCB's fed to a station 17 must be in a known orientation. The PCB's 10 are provided with registration holes 12 arranged to receive registration or data pins 14 on a table 15 at the station 17. Due to manufacturing tolerances, mere engagement of registration pins in registration holes is insufficient to ensure exact orientation and location of the PCB in accurate subsequent placement of components thereon.

In accordance with the present invention, the station 17 is a viewing and comparing station. Discrepancies between the actual and intended position of the PCB and the location of surface characteristics (component locations) thereon can then be determined.

The apparatus of the invention provides a feed position 20 whereat a next PCB 10, fed from a store 11, may be located. The table 15 is an X-Y table and serves to receive a PCB 10 from the feed position 20 in a position 22 wherein the PCB is mounted with its registration holes 12 engaged by the registration pins 14 of the table 15. The PCB 10 is clamped to the table 15 in such registered position.

The table 15 carrying the clamped PCB 10 is moved to a position beneath a viewing head 24 and is stepped through a program (corresponding to, for example, the program for placing components on the board 10) which examines the surface characteristics e.g. component locations. The viewing head 24 comprises a video camera having a field of view matching at least the area of a location where a component is to be placed. The output of the camera is fed to a microprocessor where it is digitised on a pixel-by-pixel basis (the pixel size being determined by the degree of accuracy required for board adjustment). The pixel digital values are compared in the microprocessor 21 with corresponding values of a model (held in a store 23) of the viewed area of a "perfectly" positioned, zero manufacturing tolerance, board. The corresponding values are held in a store 23. The X-Y discrepancies, the error values, between the model and the true position of the surface characteristic (the component location) are determined by the microprocessor 21 and stored, for example on a floppy disc 13, the drive of which forms part of the store 23.

The PCB 10 is then moved from the table 15 to a stack 19 and a next PCB 10 is then fed to the table 15 and its surface characteristics similarly compared, the differences (which may be in vector form) determined and stored on the disc 13, and this PCB 10 is then stacked. The process is repeated until the differences for each PCB 10 of the series has been determined. The stack 19 of PCB's 10 and the floppy disc can then be moved to a next stage 25 in the manufacturing process whereat each PCB 10 is placed on a registration table. Control means (not shown) reads the vector differences for that PCB, moves the registration table of the stage to position each PCB component location beneath a machine tool head of the stage which performs the appropriate operation e.g. the application of a glue, for subsequent onsertion of a component, or the insertion of the correct component at that location. The table of the stage 25 is then stepped (with the applied differences) to move the next component location of the PCB 10 beneath the machine tool head of the stage and so on.

The board 10 is then moved to a next stage 27 of the manufacturing process.

In an alternative embodiment, the mean vector difference between the true position of the board 10 and the desired position of the board 10 is determined. In this way, a "best fit" of the board area is determined. The differences are stored. The table 15 is then stepped through the rest of the program. At each step, discrepancies necessary to zero the position of the board 10 are determined, and stored. A mean vector difference may then be determined. The table 15 is then returned to alignment with the feed position 20.

Referring to FIGS. 2 to 5 of the drawings, a further embodiment of the invention will be described with reference to the alignment of PCB's in an automated component placing station 18 of a manufacturing process. In these drawings, like reference numerals indicate similar parts. In this embodiment, the comparing and placement stations are linked so that vector differences may be stored in volatile memory in the store 23. It is essential, in such a process, that each PCB be accurately registered relative to a component placing head. To this end each PCB 10 of a series of PCB's fed to the station must be in a known orientation. The PCB's 10 are again provided with registration holes 12 arranged to received registration or data pins 14 on a table 16 at the station 18.

In accordance with this embodiment of the present invention, a viewing and comparing station 22 is included in the component placing station 18. Discrepancies between the actual and intended position of the PCB can then be determined and used immediately for component placement.

The apparatus of this embodiment of the invention provides a feed position 20 whereat a next PCB 10, fed from a store (similar to the store 11), may be located. The table 16 is an X-Y table and serves to receive a PCB 10 from the feed position 20 in a first position 22 wherein the PCB is mounted with its registration holes 12 engaged by the registration pins 14 of the table 16. The PCB 10 is clamped to the table 16 in such registered position.

The table 16 carrying the clamped PCB 10 is moved (FIG. 2) to a position beneath a viewing head 24 and is stepped through a program corresponding to the program for placing components on the board 10. The viewing head comprises a video camera having a field of view matching the area where a component is to be placed, the output of which is fed to a microprocessor similar to the microprocessor 21 of FIG. 1 and digitised, on a pixel-by-pixel basis (the pixel size being determined by the degree of accuracy required for board adjustment). The pixel digital values are compared in the microprocessor with corresponding values (held in a store similar to the store 23 of FIG. 1) of a model of the viewed area of a "perfectly" positioned, zero manufacturing tolerance, board and the X-Y discrepancies between the model and the viewed component location of the board area determined. The discrepancies are stored. The table 16 is then stepped through the rest of the program. At each step, discrepancies necessary to zero the position of the board 10 are determined, and stored. The table 16 is then returned to alignment with the feed position 20 (FIG. 4).

Figure 4:
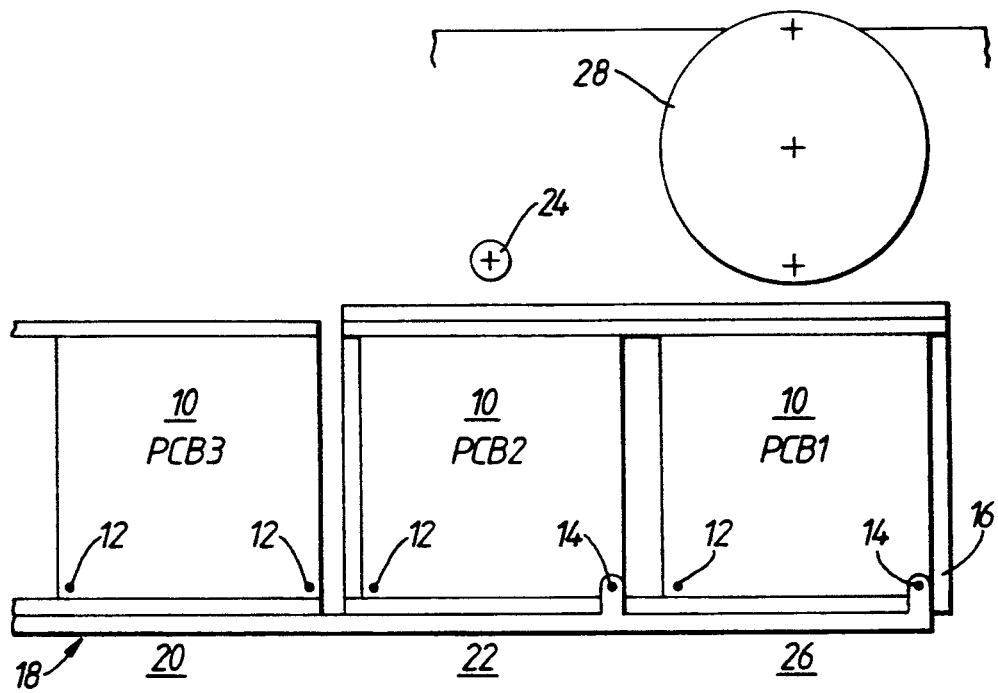
Figure 5:
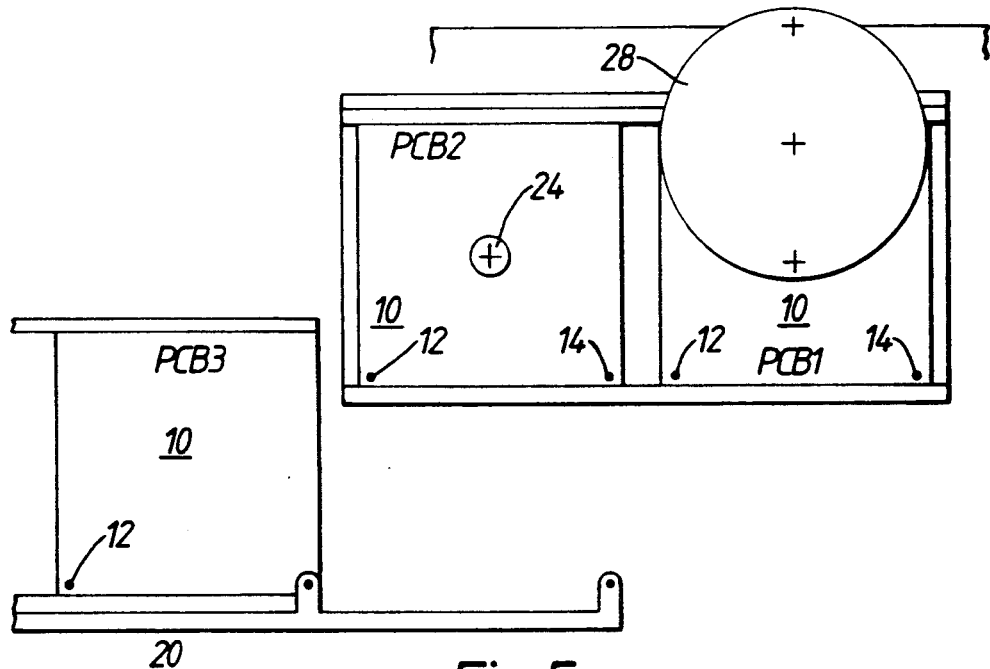

In the arrangement shown in FIG. 4, the first board 10 is translated laterally from the first position 22 to a second position 26 and a next board 10 is fed from the feed position 20 to the first position 22. In its translation from the first to second position, the first board 10 is displaced in a predetermined direction and by a predetermined amount so that it retains its registration. The second board, in its movement onto the table 16 from the feed position 20, is clamped into its registration position on the pins 14.

The table 16 carrying the first board 10 in the second position 26 and the second board 10 in the first position 22 is moved to the position beneath the viewing head 24 and beneath a rotary assembly head 28. The table 16 is then stepped through its X-Y program appropriately modified by the stored X-Y discrepancies for each area where a component is to be placed. The head 28 is indexable and is arranged to insert components (not shown) into or onto the board 10 at the predetermined locations. Simultaneously, the second board 10 is viewed by the camera 24 and its surface characteristics (located in the corrected position of the first board by virtue of the adjustment of the X-Y table 16) compared with the model.

Any further discrepancies on the second board between the "correct" position of the first board are noted and summed algebraically with the discrepancies of the first board. This may be effected by direct comparison with the original desired model or with the "stored" position of the first board now incorporated into the X-Y stepping program.

After placement of the components on the first board and determination of X-Y discrepancies of the various locations of the second board, the table is moved back to its feed position. The first board is unclamped and fed therefrom. The second board is moved to the second position 26 and a third board is fed from the feed position 20 to the first position 22. The cycle is then repeated.

Generally, a series of PCB's mass-produced on a production line will tend to have the same discrepancies from the model. Little or no change in position will then be necessary in the X-Y stepping program from that determined for the first board. However, as each board has its various locations compared with the model, any variations that do exist are automatically catered for.

As the viewing area is relatively small, for example, 10 or 15 mm square, the number of pixels necessary for accurate determination of the discrepancies is correspondingly reduced. A/D converters for digitising the pixel information need not be excessively fast to be able to process the viewed image in a time equal to or less than the component placement time. The production line is thus maintained at its normal through rate.

It may be found that a single vector correction of the whole board 10 may suffice for subsequent manufacturing operations. In this case, the mean vector difference which provides a "best fit" of the board to the model may be determined and this single vector correction stored for use in subsequent manufacturing operations.

As stated above, the store may be temporary e.g. in RAM of the store 23 in which the vector differences can be used in a conjoined apparatus as shown in FIGS. 2 to 5 or, if a production line of linked apparatus (stages 25, 27 etc.) is provided, the microprocessor 21 may act as controller for all such linked apparatus. Alternatively, the vector differences can be stored on a floppy disc for use in subsequent manufacturing operations on separate machines having controllable tables for the PCB's.

In yet a further embodiment, each PCB may have a machine readable print out of the vector differences or the mean vector difference applied thereto.

The invention is not confined to the precise details of the foregoing examples and variations may be made thereto.

For example, if each PCB is provided with a machine readable identifier e.g. a bar code number, the vector differences and the identifier may be stored together (either temporarily in RAM or more permanently or a magnetic storage medium such as a floppy disc) and/or applied as a printed out machine readable label attached to the PCB 10.

Thus, the automatic optical inspection station may be linked to other manufacturing apparatus or may be a stand alone unit. Out-of-tolerance PCB's can then be employed with much fewer rejects either of boards or, more costly, of boards with incorrectly placed components.

The invention has been described in relation to the registration of a PCB for the subsequent placement of components therein or thereon. It will be appreciated that the invention is applicable to any production line wherein an article position has to be accurately registered before subsequent operations can be performed at specific locations thereon.

Dependant upon the accuracy required, viewing and comparison can be on the basis of the whole article or of a plurality of locations on the article.

The stored discrepancies may be cumulative without reference to the model (save for the first article viewed).

In relation to PCB's, many apparatus are known for the gluing and/or placing of components. The invention is applicable to most such apparatus as an interposed step in the production line prior to the gluing and/or placement step(s).

Other variations are possible within the scope of the present invention.

We claim:

1. A method of registration of an article of a series of articles whereon component locations must be accurately known for subsequently inserting components on said locations, the method comprising the steps of positioning a first article of the series in a predetermined location with respect to a comparator, comparing the component locations of the article with a desired model, determining the differences between the component locations of the article and those of the desired model, storing the determined differences, inserting components into said article in accordance with said stored differences and repeating the steps with a next article of the series.

2. A method as claimed in claim 1 wherein the differences are stored on magnetic storage medium such as a floppy disc.

3. A method as claimed in claim 1 wherein the differences are fed to subsequent apparatus in synchronism with the feed of the article thereto.

4. A method as claimed in claim 1 wherein the article is positioned on a registration plate movable in X-Y directions.

5. A method as claimed in claim 4 wherein a next article is positioned on the registration plate, for comparison with the model, whilst a first article, on the registration plate, is stepped through a component placing program.

6. A method as claimed in claim 1 wherein each article is a printed circuit board and its surface characteristics are component locations thereon.

7. A method as claimed in claim 1 further comprising the steps of mounting the article on a registration plate, positioning the article in accordance with registration means thereof and the predetermined stored differences, and performing a manufacturing operation at the location of a surface characteristic thereof.

8. A method as claimed in claim 1 wherein the article is a printed circuit board, further comprising the steps of mounting the board on a registration plate of a component placing machine, positioning the board in accordance with registration means thereof, feeding the predetermined stored differences to the apparatus, and positioning the board in accordance with the stored differences to present a component location for the insertion of a component on the board.

9. A method as claimed in claim 1 wherein the article is a printed circuit board, further comprising the steps of mounting the board on a registration plate of a gluing machine, positioning the board in accordance with the registration means thereof, feeding the predetermined stored differences to the apparatus, and positioning the board in accordance with the stored differences to apply glue to a component location, prior to onsertion of a component on the board.

10. A method of registration of a series of articles comprising the steps of:

feeding a first article, having component locations, to a table;
positioning said first article on the table in a predetermined location with respect to a comparator;
moving the table carrying the first article to a position beneath a viewing head;
examining the component locations of the first article;
digitizing a signal produced from examining the locations of the first article;
comparing the digitized signal with a stored model;
generating an error value based upon discrepancies between the digitized signal and the stored model;
storing the error value for subsequent use;
feeding a second article to the table;
moving the table a specified distance thereby placing the first article beneath a machine tool head for insertion of components on the first article based on the generated error value and placing the second article beneath the viewing head; and
repeating the previous steps with the second article beginning with the step of examining.

11. A method of registration of an article of a series of articles whereon component locations must be accurately known for subsequently inserting components on said locations, the method comprising the steps of positioning a first article of the series in a predetermined location with respect to a comparator, comparing the component locations of the article with a desired model, storing the determined differences between the component locations of the article and those of the desired model, storing the determined differences, retrieving the stored differences for inserting components into said article and repeating the steps with a next article of the series using the stored differences in the comparison with the next article of the series.

* * * * *